United States Patent

Nagai et al.

[11] Patent Number: 5,835,790
[45] Date of Patent: Nov. 10, 1998

[54] APPARATUS FOR DATA TRANSFER CAPABLE OF PIPELINE PROCESSING BY CASCADING PROCESSING CIRCUITS WITHOUT RELYING ON EXTERNAL CLOCK WITH AN OUTPUT CIRCUIT RELYING ON EXTERNAL CLOCK

[75] Inventors: Eiichi Nagai; Yoshihiro Takemae; Hirohiko Mochizuki; Yukihiro Nomura, all of Kawasaki, Japan

[73] Assignee: Fujitsu Limited, Kawasaki, Japan

[21] Appl. No.: 526,278

[22] Filed: Sep. 11, 1995

[30]     Foreign Application Priority Data

Oct. 6, 1994 [JP] Japan .................................. 6-242658

[51] Int. Cl.⁶ ..................................................... G06F 3/00
[52] U.S. Cl. ............................................ 395/881; 395/551
[58] Field of Search ........................ 326/21, 98; 310/348; 365/203, 230.02; 377/66; 395/307, 881, 551

[56]         References Cited

U.S. PATENT DOCUMENTS

| 4,058,773 | 11/1977 | Clark et al. ................................ 377/66 |
| 5,029,135 | 7/1991 | Okubo ..................................... 365/203 |
| 5,208,490 | 5/1993 | Yetter ..................................... 326/98 |
| 5,287,327 | 2/1994 | Takasugi ............................. 365/230.02 |
| 5,329,176 | 7/1994 | Miller, Jr. et al. ......................... 326/21 |
| 5,386,585 | 1/1995 | Traylor .................................... 395/307 |
| 5,513,132 | 4/1996 | Williams .................................. 310/348 |

*Primary Examiner*—Thomas C. Lee
*Assistant Examiner*—David Ton
*Attorney, Agent, or Firm*—Nikaido, Marmelstein, Murray & Oram LLP

[57]             ABSTRACT

A data transfer apparatus is disclosed which has a first, a second, and a third pipeline processing circuits disposed in cascade connection. The first and the second pipeline processing circuits are each provided with an arbitrary signal processing circuit, a switch element for controlling the introduction of data into the signal processing circuit, and a switch control circuit for turning on the switch element on detecting completion of the transfer of data from the signal processing circuit to a pipeline processing circuit in the subsequent stage. The third pipeline processing circuit is provided with an output circuit and a switch element for introducing data transferred from the second pipeline processing circuit into the output circuit as synchronized with an external clock signal. Between the first and the second pipeline processing circuit, therefore, data can be transferred with a timing conforming to the timing of the operation of the signal processing circuit without being synchronized with an external clock signal. In the output circuit, data can be issued as synchronized with an external clock signal. Thus, a signal of a very high frequency can be selected as a clock signal for setting the timing of the whole of a system incorporating the data transfer apparatus therein.

6 Claims, 7 Drawing Sheets

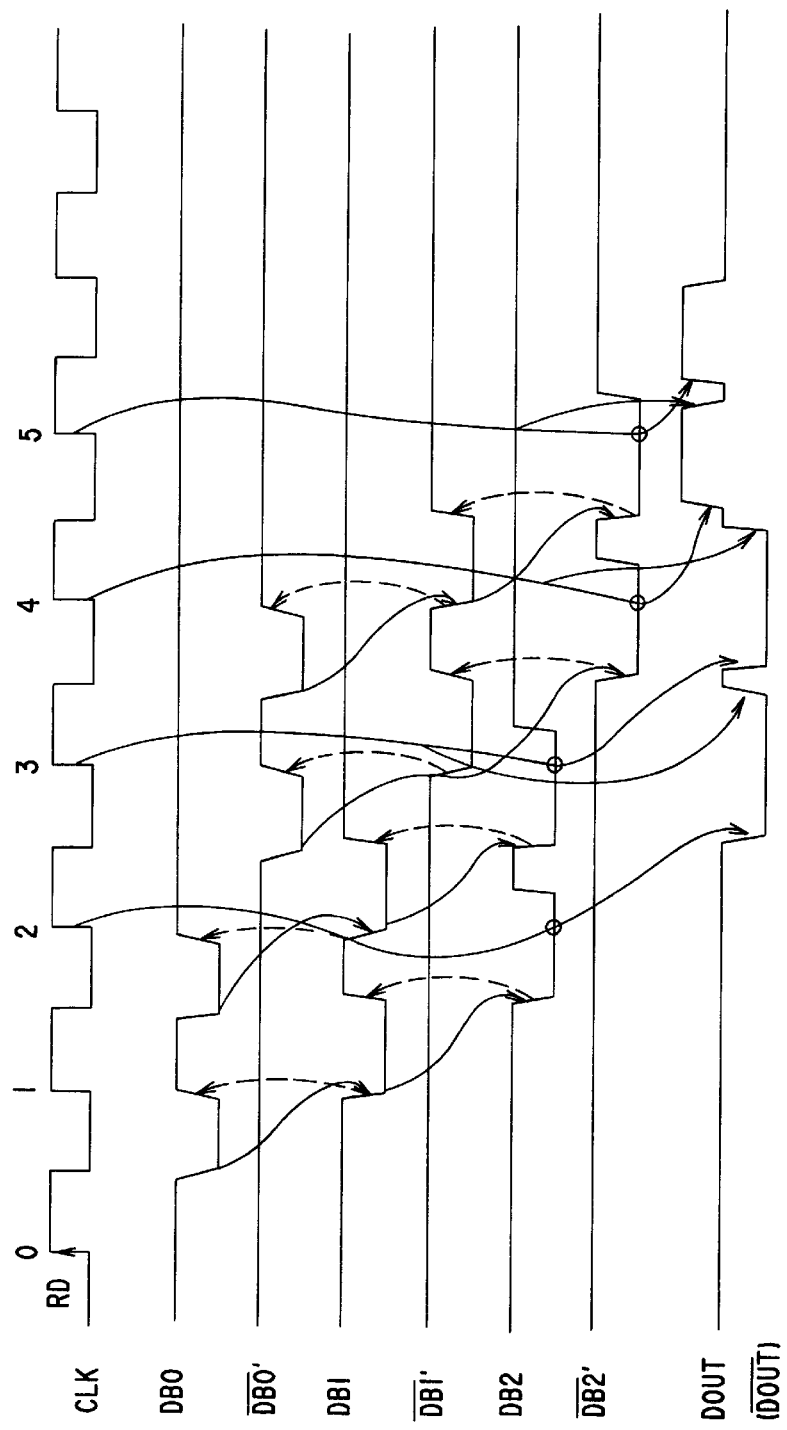

APPARATUS FOR DATA TRANSFER CAPABLE OF PIPELINE PROCESSING BY CASCADING PROCESSING CIRCUITS WITHOUT RELYING ON EXTERNAL CLOCK WITH AN OUTPUT CIRCUIT RELYING ON EXTERNAL CLOCK

BACKGROUND OF THE INVENTION

1. Field of the Invention

This invention relates to a data transfer apparatus which is capable of pipeline processing and more particularly relates to a data transfer apparatus which is capable of driving a synchronous dynamic random access memory at a higher speed than attainable heretofore.

2. Description of the Prior Art

In recent years, the trend of various data processing apparatuses toward increasingly high functional and increasingly wide diversification has been urging the necessity for expediting data processing. In the case of the dynamic random access memory (DRAM), for example, the demand for higher speed has been gaining in enthusiasm, let alone that for greater capacity. Since the conventional general-purpose DRAM has a limited operating speed, the development of a synchronous DRAM adapted to operate a plurality of pipeline processing circuits as synchronized with an external clock signal (hereinafter referred to as "SDRAM") is longed for.

The existing SDRAM has an operating speed of about 100 MHz at most, whereas the CPU (central processing unit) which controls the input and output of the SDRAM has a still higher operating speed. Thus, the SDRAM is required to have an operating speed exceeding 100 MHz.

Generally, the SDRAM implements data transfer by feeding external clock signals synchronously with the input transistors serving the relevant pipeline processing circuits and effecting simultaneous switching control of the individual transistors.

The existing SDRAM, therefore, can fully function so long as the operating frequency of the external clock signal is not more than 100 MHz. It is not feasible, however, to use external clock signals at an operating frequency exceeding 100 MHz for the sake of expediting data processing. In other words, the existing SDRAM is incapable of transferring data at a speed exceeding 100 MHz.

FIGS. 1 and 2 are diagrams to aid in the description of the architecture of the data transfer in the conventional SDRAM. More specifically, FIG. 1 is a block diagram illustrating the construction of a data read part and FIG. 2 is a diagram showing the operation of the data read part in terms of wave forms.

The read part of an SDRAM which adopts a pipeline system operating synchronously with an external clock signal (hereinafter referred to as "CLK signal"), for example, is provided as shown in FIG. 1 with a first pipeline processing circuit PC1 incorporating therein input transistors TN11 and TN12 and a decoding circuit 100, a second pipeline processing circuit PC2 incorporating therein input transistors TN21 and TN22 and a data reading circuit 200, and a third pipeline processing circuit PC3 incorporating therein input transistors TN31 and TN32 and a data output circuit 300.

This SDRAM implements data transfer by controlling the switching of the input transistors TN11 and TN12, TN21 and TN22, and TN31 and TN32 respectively of the pipeline processing circuits PC1 to PC3 synchronously with the CLK signal.

Specifically as shown in FIG. 2, when the signal CLK reaches an "H" level (input of Read Demand RD), the transistors TN11 and TN12 in the first pipeline processing circuit PC1 are turned on and the data DB0' and the inverted delay data $\overline{DB0'}$ are admitted into the decoding circuit 100 so as to effect the processing of decoding the input data. Simultaneously, the transistors TN21 and TN22 of the second pipeline processing circuit PC2 are turned on and the data $\overline{DB1'}$ and the inverted delay data DB1 are admitted into the data reading circuit 200 as synchronized with the introduction of the data DB0 and the inverted delay data $\overline{DB0'}$ into the decoding circuit 100. By the same token, when the transistors TN31 and TN32 are turned on, the data DB2 and the inverted delay data $\overline{DB2'}$ are introduced into the data output circuit 300.

In the conventional data transfer circuit constructed as described above, the data transfer is carried out by feeding the clock signal CLK in common to the input transistors TN11, TN12, TN21, TN22, TN31, and TN32 of the pipeline processing circuits PC1 to PC3 and simultaneously controlling the switching of the transistors TN11, TN12, TN21, TN22, TN31, and TN32.

When the frequency of the clock signal CLK is not more than 100 MHz, therefore, the data which are parallelly processed by the pipeline processing circuits can be transferred (burst output) as synchronized with the clock signal CLK, though depending on the capacities of the pipeline processing circuits PC1 to PC3 for processing signals. When a clock frequency of some hundreds of MHz or more is used for the purpose of expediting the data processing, however, the phases for defining parallel data processing and feeding the clock signal CLK are not easily separated.

For effecting data transfer between the pipelines, for example, it is necessary to set the timing for the data transfer at the moment that the data transfers in all the pipeline processing circuits have been completed. In all the pipelines, which consumes the longest time in the transfer of data automatically determines the largest frequency of the clock signal CLK. As a result, the conventional data transfer circuit encounters the problem that the data transfer at a frequency exceeding 100 MHz, i.e., the maximum processing speed for the SDRAM, will become difficult.

SUMMARY OF THE INVENTION

This invention has been produced for the purpose of solving the aforementioned problem entrained by the conventional data transfer apparatus. It has for an object thereof the provision of a data transfer apparatus which, owing to the use of a device adapted for introducing data into pipeline processing circuits, improves the speed of data transfer in the pipeline processing circuits by effecting the introduction of data into the pipeline processing circuits except at least for that at the last stage without relying on the external clock signal.

FIG. 3 is a diagram illustrating the operating principle of the data transfer apparatus according to this invention. The data transfer apparatus of this invention, as illustrated, comprises a first, a second, and a third pipeline processing circuit P1, P2, and P3 to be used for pipeline processing. The first and the second pipeline processing circuit P1 and P2 are respectively provided with switching elements SW1 and SW1' for controlling the introduction of data D, signal processing circuits 11 and 11' for introducing the data D and effecting various signal processing in response thereto, and switch control circuits 12 and 12' for detecting completion of the transfer of data emitted from the signal processing circuit 11 and turning on the switch elements SW1 and SW1'.

The data transfer apparatus of this invention further comprises the third pipeline processing circuit P3. This circuit P3 is provided with a switch element SW2 for controlling the introduction of the data D emitted from the signal processing circuit 11' in the pipeline processing circuit P2 synchronously with the external clock signal CLK and an output circuit 13 for introducing the data D and emitting a signal in response thereto. Between the pipeline processing circuits P2 and P3 may be interposed a plurality of pipeline processing circuits which incorporate therein arbitrary signal processing circuits and switch elements and switch controlling circuits similar in construction to the switch elements and switch controlling circuits in the circuits P1 and P2.

The data processing apparatus of this invention which is constructed as described above operates as follows to transfer data at a high speed. When the data D are introduced into the signal processing circuit 11 of the first pipeline processing circuit P1 and the data D are transferred to the signal processing circuit 11' in the subsequent pipeline processing circuit P2, the switch controlling circuit 12 detects completion of the transfer of data and emits a data transfer completion detection signal S to the switch element SW1. In response to this signal S, the switch element SW1 assumes a closed state and introduces new input data D into the signal processing circuit 11.

The data transfer apparatus of this invention, unlike the conventional apparatus, turns on and off the switch elements SWI in response to the signal S, introduces new data D into the signal processing circuit 11, and effects desired data processing on the data D without relying on an external clock signal.

Likewise in the subsequent pipeline processing circuit P2, the signal processing circuit 11' confirms completion of the transfer of data to the subsequent signal processing circuit such as, for example, the output circuit 13 and then introduces new data from the preceding signal processing circuit 11. The output circuit 13 turns on and off the switch element SW1 as synchronized with the external clock signal CLK, introduces the data from the preceding signal processing circuit, and produces an output to an external device.

As described above, the data transfer apparatus of this invention is capable of transferring data between the pipeline processing circuits except that of the last stage as synchronized with the state of data transfer (after or during the transfer of data) in the preceding signal processing circuit without relying on the external clock signal. When this apparatus is applied to such a memory device as the SDRAM which happens to adopt for overall control thereof a clock signal having such a high frequency as some hundreds of MHz, a speed higher than the speed at which the SDRAM can be effectively driven, therefore, the operation of data transfer in the pipeline processing circuits is not affected by this clock signal. For this reason, the memory device is enabled to use an overall clock signal of a frequency exceeding some hundreds of MHz and, as a result, enjoys a generous increase in the data processing speed of the whole device.

This invention, accordingly, allows construction of a synchronous type memory device which is operated with a clock signal CLK having a frequency exceeding some hundreds of MHz. It also allows construction of a data processing system which uses a CPU operated with a clock signal CLK having a frequency exceeding some hundreds of MHz as a master and the memory device under discussion as a slave.

BRIEF DESCRIPTION OF THE DRAWINGS

FIG. 7 is a diagram showing the operation of the data read part shown in FIG. 5 in terms of wave forms.

DETAILED DESCRIPTION OF THE EMBODIMENTS

Now, embodiments of this invention will be described below with reference to the accompanying drawings.

First, the whole construction of an SDRAM using a data transfer apparatus as one embodiment of this invention will be briefly described below with reference to FIG. 4.

Figure 1:
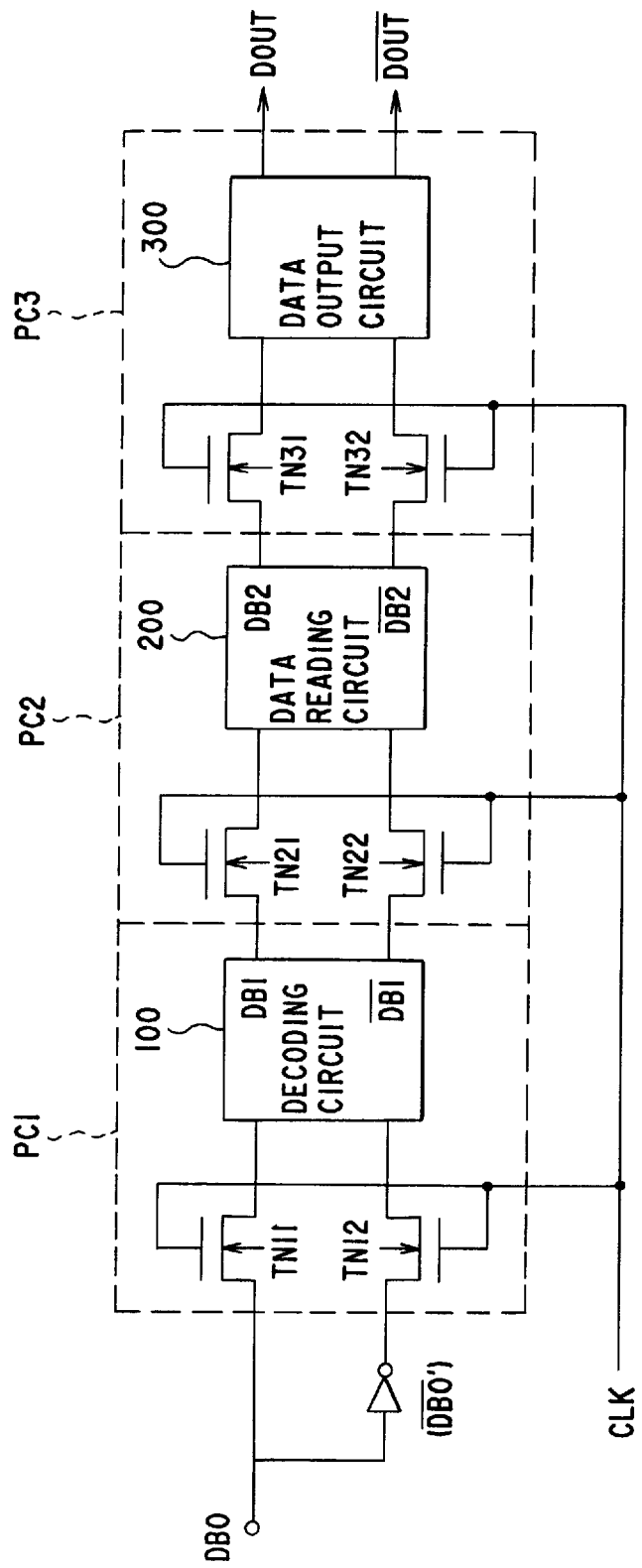
FIG. 1 is a block diagram illustrating the construction of a data read part of a conventional SDRAM.
Figure 2:
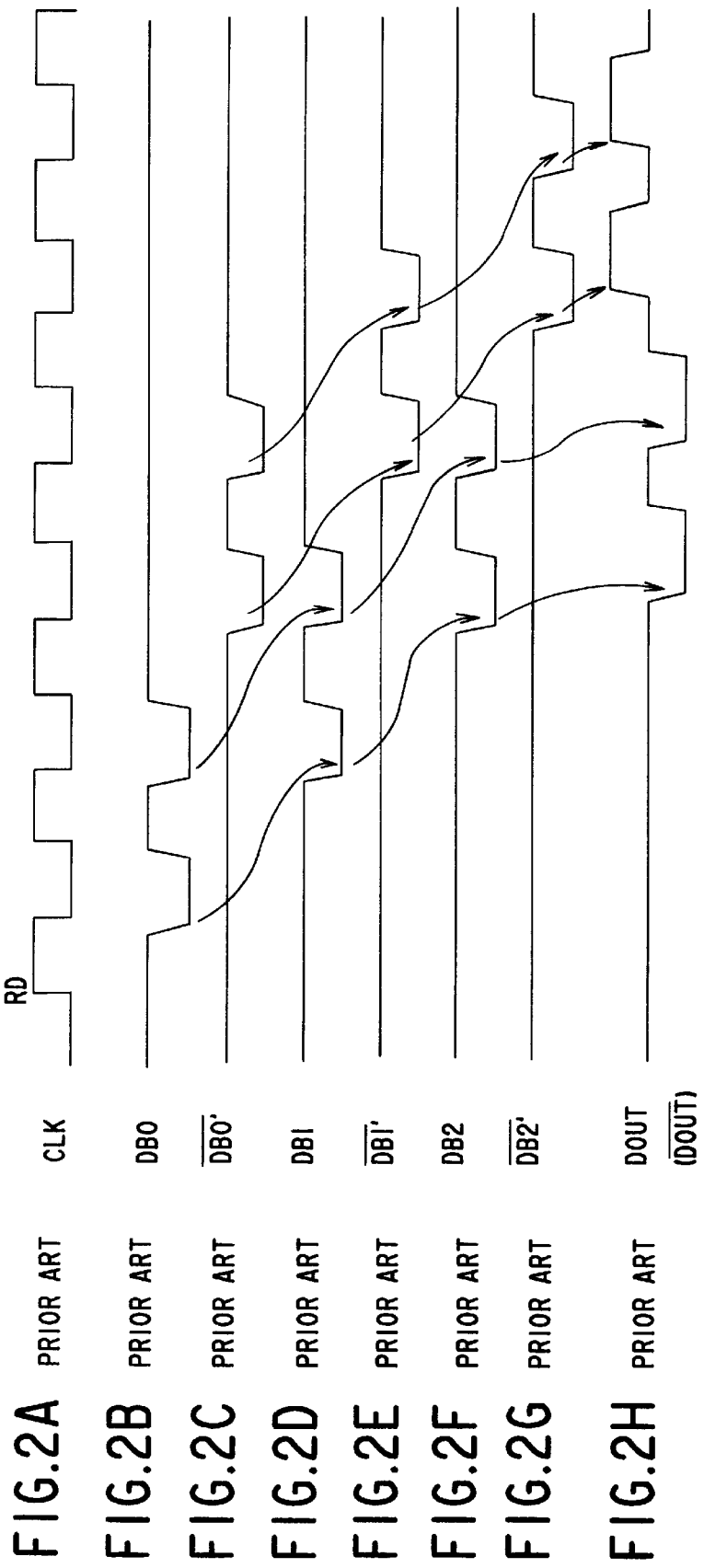
FIG. 2 is a diagram showing the operation of the data read part in terms of wave forms.
Figure 3:
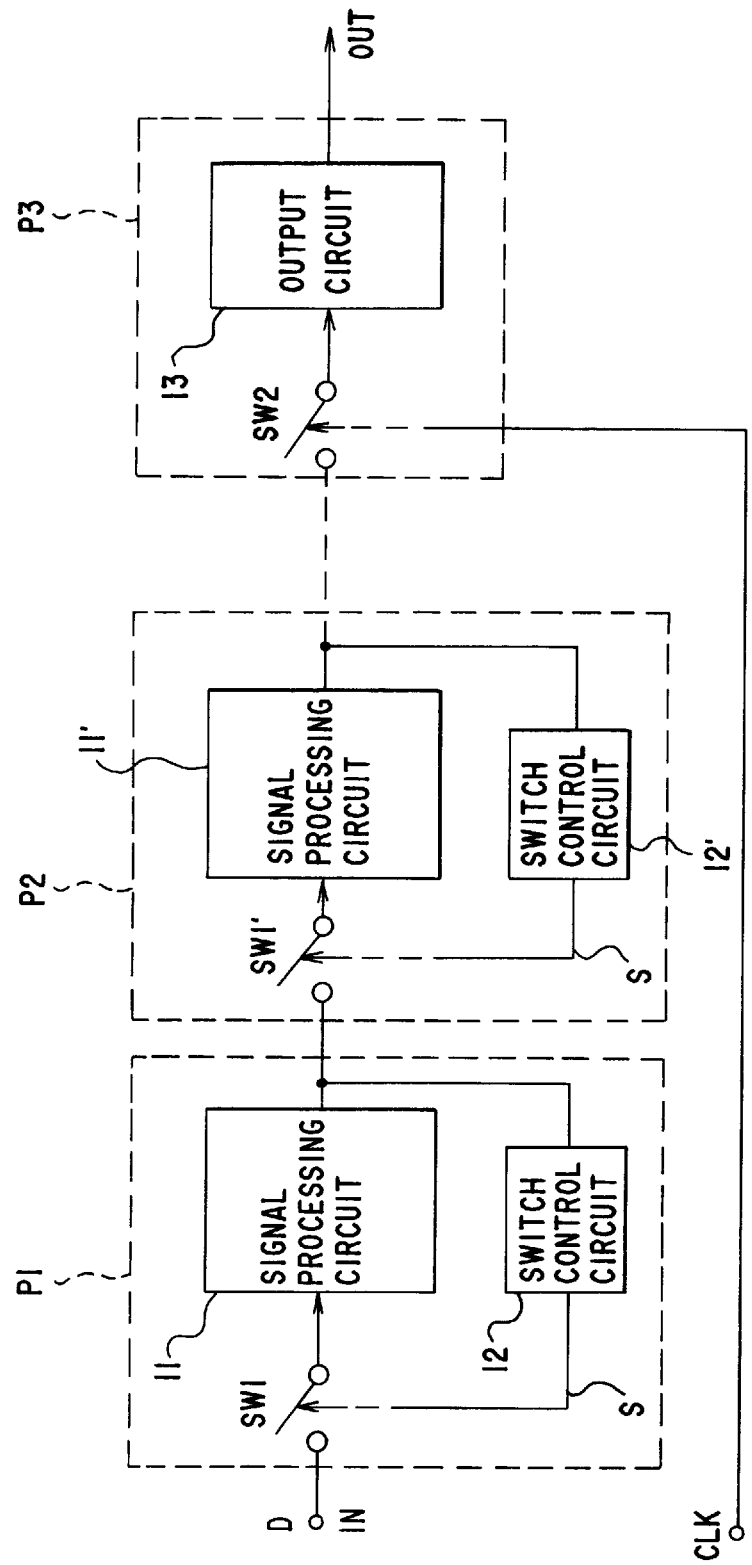
FIG. 3 is a diagram showing the operating principle of a data transfer apparatus according to this invention.
Figure 4:
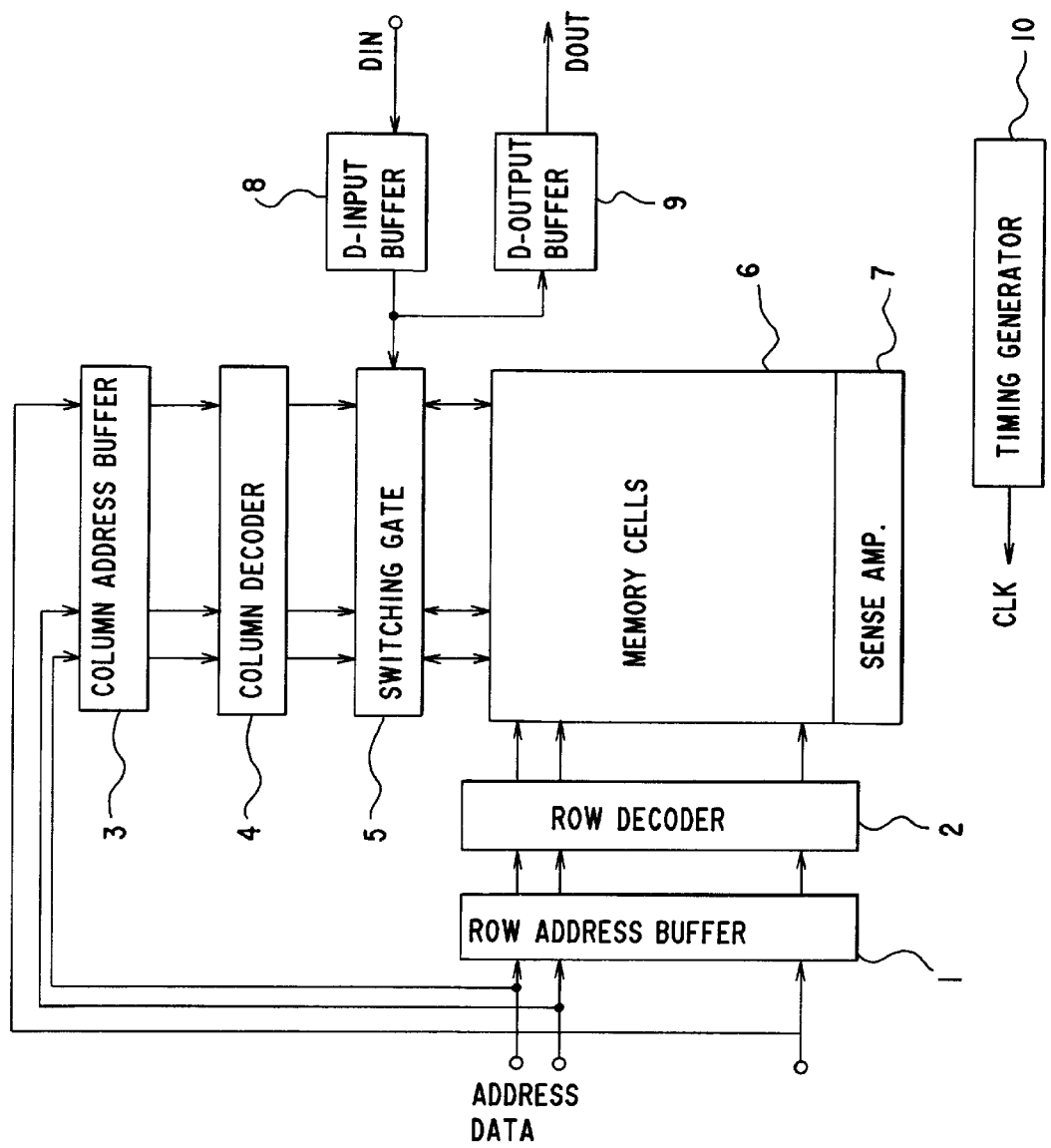
FIG. 4 is a block diagram showing the whole construction of a SDRAM incorporating therein the data transfer apparatus as one embodiment of this invention.

As shown in FIG. 4, 1 stands for a row address buffer for storing a row component of an address signal, 2 for a row decoder for decoding an incoming address signal, 3 for a column address buffer for storing a column component of the address signal, 4 for a column decoder for decoding the incoming address signal, 5 for a switching gate, 6 for memory cells, 7 for a sense amplifier for amplifying a signal read out of the memory cells 6, 8 for a decode output buffer, 9 for a data output buffer, and 10 for a timing generator for generating a clock signal CLK for controlling the memory device as a whole.

The SDRAM of FIG. 4, when operated by the CAS system, for example, activates the column address buffer 3 in response to the last transition of a clock signal, turns on one of the gates of the switching gate 5 as prompted by the column decoder 4, and proceeds to write and read data in the ensuant state. A signal emitted from the memory cells 6 is amplified by the sense amplifier 7 and derived from the data output buffer 9.

Now, a data transfer apparatus as one embodiment of this invention will be described below with reference to FIGS. 5 to 7. The present embodiment is applied to a data read part of the SDRAM.

Figure 5:
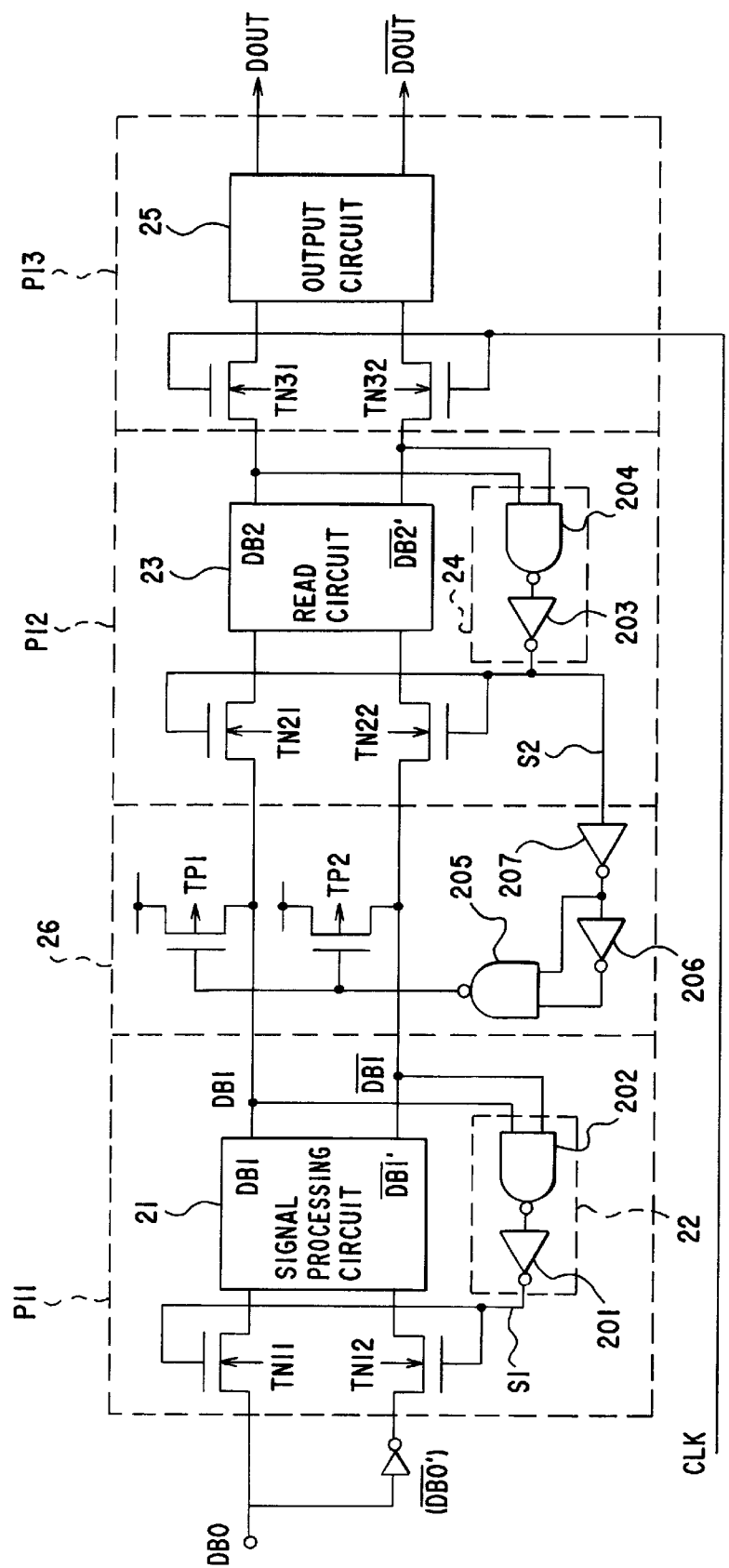
FIG. 5 is a block diagram showing the construction of a data read part of the SDRAM shown in FIG. 4.

This data transfer apparatus, as shown in FIG. 5, comprises three pipeline processing circuits P11 to P13 and a resetting circuit 26.

Specifically, the pipeline processing circuit P11 is provided with switch elements TN11 and TN12, a signal processing circuit 21, and a switch control circuit 22. The signal processing circuit 21 incorporates therein a row address buffer 1, a row decoder 2, a column decoder 3, and a column decoder 4 in the SRAM shown in FIG. 4. The switch elements TN11 and TN12 are each formed of an n type field effect transistor, with the drain connected to the address terminal and the source to the signal processing circuit 21. The gate is connected to the switch control circuit 22. The elements TN11 and TN12 control the introduction of data (hereinafter referred to simply as "data DB0 and $\overline{DB0}$"). At the time that the gate signal has reached the "H"

level, for example, they introduce the data DB0 and $\overline{DB0'}$ into the signal processing circuit 21.

The signal processing circuit 21, on introducing the data DB0 and $\overline{DB0'}$, decodes them and emits a read control signal (hereinafter referred to simply as "DB1, $\overline{DB1'}$"), for example, to a read circuit 23 of the subsequent pipeline processing circuit 12 (in compliance with the method of data reading in the CAS system). The switch control circuit 22 serves to detect completion of the transfer of the data DB1, $\overline{DB1'}$ and turn on the switch elements TN11 and TN12. The circuit 22, for example, comprises a two-input NAND circuit 202 and an invertor 201, computes a NAND logic of the data DB1 and $\overline{DB1'}$, and emits an inverted logic signal (data transfer completion detection signal) S1 to the switch elements TN11 and TN12.

The second pipeline processing circuit P12 comprises switch elements TN21 and TN22, a read circuit 23, and a switch control circuit 24. The read circuit 23 incorporates therein a switching gate 5, memory cells 6, and a sense amplifier 7 in the SDRAM of FIG. 4. The switch elements TN21 and TN22 are each formed of an n type field effect transistor, with the drain connected to the output of the signal processing circuit 21 and the source connected to the read circuit 23. The gate is connected to the switch control circuit 24. The elements TN21 and TN22 serve to control the introduction of the data DB1 and $\overline{DB1'}$.

The read circuit 23, on introducing the data DB1 and $\overline{DB1'}$, reads them and emits a read signal (hereinafter referred to simply as "DB2, $\overline{DB2'}$") to an output circuit 25 of the subsequent pipeline processing circuit P13. The switch control circuit 24 serves to detect completion of the transfer of the data DB2 and $\overline{DB2'}$ and turns on the switch elements TN21 and TN22. The circuit 24, for example, comprises a two-input NAND circuit 204 and an invertor 203, compute a NAND logic of the data DB2 and $\overline{DB2'}$, and emits an inverted logic signal to the switch elements TN21 and TN22.

The reset circuit 26 serves to reset a data signal line which interconnects the signal processing circuit 21 and the read circuit 23. The reset circuit 26, for example, comprises p type field effect transistors TP1 and TP2, a two-input NAND circuit 205, and invertors 206 and 207. The circuit 26 has the output thereof controlled based on the data transfer completion detection signal S2 which is issued from the switch control circuit 24. After the signal S2 has risen to the "H" level, for example, the transistors TP1 and TP2 are turned off to lower the data signal line to the "L" level. After the signal S2 has fallen to the "L" level, the transistors TP1 and TP2 are turned on to pull the data signal line up to the "H" level. The circuit 26 may be omitted.

The third pipeline processing circuit P13 comprises switch elements TN31 and TN32 and the output circuit 25. The output circuit 25 is equivalent to the data output buffer 9 in the SDRAM of FIG. 4. The switch elements TN31 and TN32 are each formed of an n type field effect transistor, with the drain connected to the output of the read circuit 23 and the source connected to the output circuit 25. To the gate is fed an external clock signal (hereinafter referred to briefly as "signal CLK"). The elements TN31 and TN32 serve to control the introduction of the data DB2 and $\overline{DB2'}$ as synchronized with the signal CLK.

The output circuit 25 serves to amplify the data DB2 and $\overline{DB2'}$ and emits read data $D_{OUT}$.

Now, the operation of the SDRAM as one embodiment of this invention will be described below with reference to FIGS. 6 and 7. FIGS. 6 (A) to (C) are explanatory diagrams showing the states of the SDRAM assumed during the transfer of data and FIG. 7 is a diagram showing the operation of the SDRAM in terms of wave forms.

When the pipeline processing circuit P13 introduces the data DB2 and $\overline{DB2'}$ anew for the purpose of reading data from the SDRAM using the data reading method with CAS (column address strobe), for example, the feed of the signal CLK to the switch elements TN31 and TN32 results in turning on the switch elements TN31 and TN32 and introducing the data DB2 and $\overline{DB2'}$ into the output circuit 25. The output circuit 25, consequently, emits the read data $D_{OUT}$ as synchronized with the signal CLK.

Incidentally, the data read method of the CAS system defines a burst length=4 and a CAS waiting time (latency)=3 as shown in FIG. 7, for example. The term "burst length" as used herein means the number of pieces of data emitted by one read command RD. As the read data $D_{OUT}$, four bits of the "L," "L," "H," and "H" are emitted. The expression "CAS waiting time" means the timing for the emission of the read data $D_{OUT}$. The data $D_{OUT}$ becomes effective at the first transition of the third signal CLK as reckoned from the first transition of the read command RD, for example.

Figure 6A:
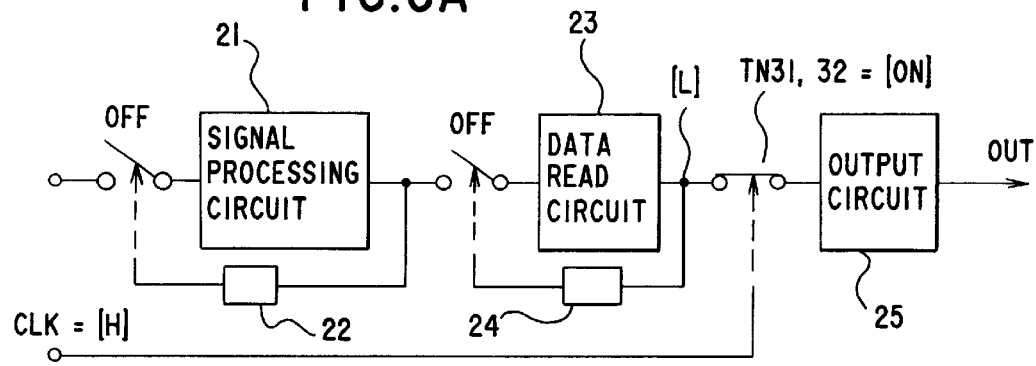
FIG. 6 is a block diagram to aid in the description of the state of transfer of data in the data read part shown An FIG. 5.
Figure 6B:
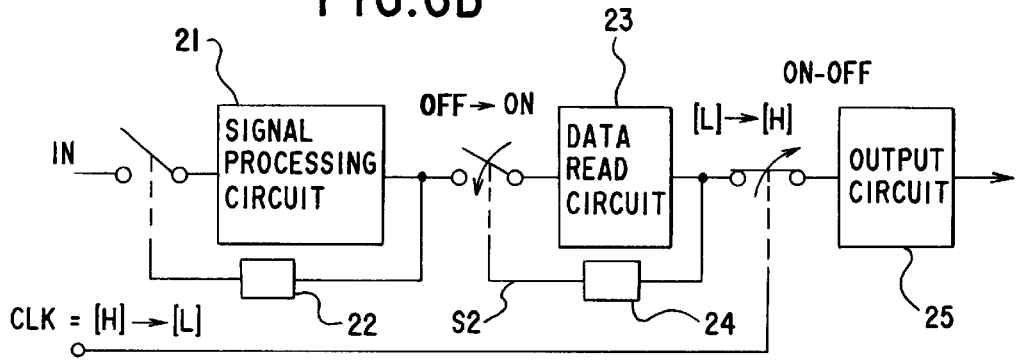
Figure 6C:
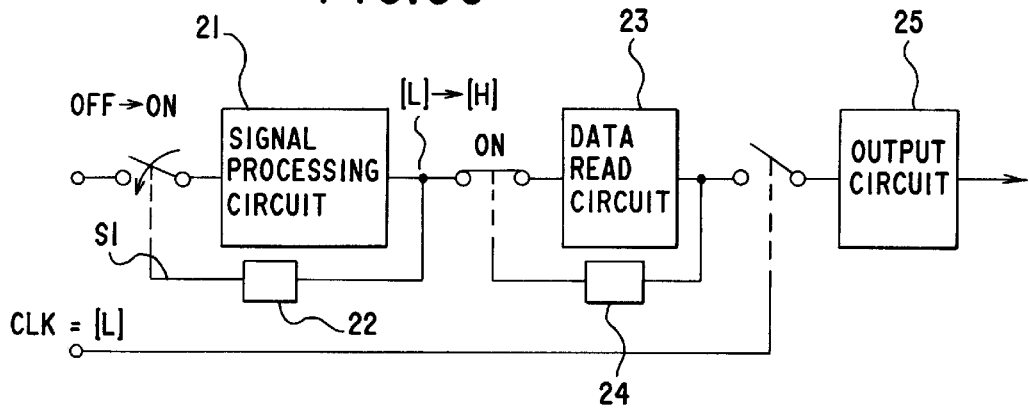

In the pipeline processing circuit P12, after the data DB2 and $\overline{DB2'}$ have been transferred to the output circuit 25 of the pipeline processing circuit P13, the data DB2=$\overline{DB2'}$ assumes a precharged state of the "H" level as shown in FIG. 6 (B) and completion of the transfer of the data is detected by the switch control circuit 24. As a result, the control circuit 24 emits a data transfer completion detection signal S2="L"→"H" level to the switch elements TN21 and TN22 and, without depending on the signal CLK as in the conventional device, turns on the switch elements TN21 and TN22 based on the signal S2="H" level, reads the data DB1, $\overline{DB1'}$ anew, and introduces them into the read circuit 23. The read circuit 23 executes the processing of parallel data reading based on the data DB1 and $\overline{DB1'}$.

Then, in the pipeline processing circuit P11, after the data DB1 and $\overline{DB1'}$ have been transferred to the read circuit 23 in the pipeline processing circuit P12, the data DB1=$\overline{DB1'}$ assumes a precharged state of the "H" level as shown in FIG. 6 (C) and completion of the transfer of the data is detected by the switch control circuit 22. In this case, when the switch control circuit 24 emits the data transfer completion detection signal S2 to the reset circuit 26, the data signal line connected to the preceding signal processing circuit 21 is reset based on the signal S2.

As a result, the control circuit 22 emits the data transfer completion detection signal S1="L"→"H" level to the switch elements TN11 and TN12 and, independently of such signal CLK as is used in the conventional device, turns on the switch elements TN11 and TN12 based on the signal S1="H" level and introduces the data DB0 and $\overline{DB0'}$ anew into the signal processing circuit 21. The signal processing circuit 21 executes the processing of parallel address decoding based on the data DB0 and $\overline{DB0'}$.

In short, the second pipeline processing circuit P12 is enabled to take in the new data DB1 and $\overline{DB1'}$ after confirming the transfer of the data DB2 and $\overline{DB2'}$ from the second pipeline processing circuit P12 to the third pipeline processing circuit P13 and the first pipeline processing circuit P11 is enabled to take in the new data DB0 and $\overline{DB0'}$ after confirming the transfer of the data DB1 and $\overline{DB1'}$ from the first pipeline processing circuit P11 to the second pipeline processing circuit P12.

The SDRAM according to the embodiment of this invention described above is provided with the three pipeline processing circuits P11 to P13 and the reset circuit 26 as shown in FIG. 5.

The first pipeline processing circuit P11, when taking in the data DB0 and $\overline{DB0'}$ anew, can turn on the switch elements TN11 and TN12 based on the data transfer completion detection signal S1 without recourse to such a signal CLK as is used in the conventional device and, in response thereto, cause the signal processing circuit 21 to process the new data DB0 and $\overline{DB0'}$.

Further, according to the embodiment of this invention, the second pipeline processing circuit P12, when taking in the data DB1 and $\overline{DB1'}$ anew, can turn on the switch elements TN21 and TN22 based on the data transfer completion detection signal S2 without recourse to such a signal CLK as is used in the conventional device and, in response thereto, cause the read circuit 23 to process the new data DB1 and $\overline{DB1'}$.

As a result, at the time that the data DB1 and $\overline{DB1'}$ cease to exist in the pipeline processing circuit P11, namely the transfer of the data DB1 and $\overline{DB1'}$ to the pipeline processing circuit P12 is completed, the pipeline processing circuit P11 is enabled to take in the new data DB0 and $\overline{DB0'}$ as synchronized with the state of data reading in the pipeline processing circuit P12.

As a consequence, the pipeline processing circuit P11 is enabled to take in the new data DB0 and $\overline{DB0'}$ after confirming the transfer of the data DB1 and $\overline{DB1'}$ from the pipeline processing circuit P11 to the pipeline processing circuit P12.

Further, the embodiment of this invention contemplates provision of the reset circuit 26 which is adapted to reset the data signal line connected to the signal processing circuit 21 on the basis of the data transfer completion detection signal S2. Since the electric potential of the data signal line is consequently stabilized, the operation of the subsequent read circuit 23 in the introduction of data can be stabilized further.

According to the embodiment of this invention, when the third pipeline processing circuit P13 introduces the data DB2 and $\overline{DB2'}$ anew, the signal CLK, on reaching the switch elements TN31 and TN32, turns these switch elements on and consequently effects the introduction of the data DB2 and $\overline{DB2'}$ into the output circuit 25.

The output circuit 25, accordingly, is enabled to issue the read data $D_{OUT}$ based on the read signal as synchronized with the signal CLK. Owing to the factors described above, therefore, a high-speed synchronous type memory device which produces a data reading motion by feeding a signal CLK of a frequency exceeding some hundreds of MHz exclusively to the final pipeline processing circuit P13 can be constructed.

As a result, a data processing system using a CPU operating with a signal CLK of a frequency exceeding some hundreds of MHz as a master and the aforementioned memory device as a slave can be constructed. Further, the data transfer speed throughout all the pipeline processing circuits P11 to P13 can be exalted.

While the embodiment of this invention has been depicted with respect to a memory device, it brings about the same effect in a data processing system which is adapted to carry out pipeline processing severally for component blocks.

What is claimed is:

1. A data transfer apparatus, comprising:
a first pipeline processing circuit provided with a first signal processing circuit, a first switch element for controlling the introduction of data to said first signal processing circuit, and a first switch control circuit for turning on said first switch element on detecting completion of the transfer of data from said first signal processing circuit; and a second pipeline processing circuit provided with a second signal processing circuit and a second switch element for controlling the introduction of the data transferred from said first signal processing circuit to said second signal processing circuit synchronously with a clock signal, wherein a resetting circuit for resetting a data signal output line emanating from said first signal processing circuit on detecting completion of the transfer of data from said first pipeline processing circuit to said second pipeline processing circuit is interposed between said first and said second pipeline processing circuit to interconnect them.

2. The data transfer apparatus according to claim 1, wherein said second signal processing circuit is a signal output circuit.

3. The data transfer apparatus according to claim 1, wherein a third pipeline processing circuit provided with a third switch element, a third signal processing circuit connected to said first signal processing circuit through said third switch element, and a third switch control circuit for turning on said third switch element on detecting completion of the transfer of data from said third signal processing circuit is interposed between said first and said second pipeline processing circuit to interconnect them.

4. The data transfer apparatus according to claim 3, wherein a plurality of said third pipeline processing circuits provided with an arbitrary signal processing circuit is cascade connected between said first and said second pipeline processing circuits.

5. The data transfer apparatus according to claim 2, wherein said first signal processing circuit is a signal decoding circuit in a synchronous DRAM, said third signal processing circuit is a signal reading circuit in said synchronous DRAM, and said second signal processing circuit is a data output circuit in said synchronous DRAM.

6. A data reading device in a synchronous DRAM, comprising:
a first pipeline processing circuit provided with a decode circuit, a first switch element for controlling the introduction of address data into said decode circuit, and a first switch control circuit for turning on said first switch element on detecting completion of the transfer of data from said decode circuit;

a second pipeline processing circuit provided with a second switch element, a signal reading circuit connected to said decode circuit through the medium of said second switch element, and a second switch control circuit for turning on said second switch element on detecting completion of the transfer of data from said signal reading circuit;

a third pipeline processing circuit provided with an output circuit and a third switch element for controlling the introduction of data transferred from said signal reading circuit into said output circuit as synchronized with a clock signal; and a resetting circuit connected between said first pipeline processing circuit and said second pipeline processing circuit and adapted to reset a data signal output line emanating from said first signal processing circuit on detecting completion of the transfer of data from said first pipeline processing circuit to said second pipeline processing circuit.

* * * * *